(12) United States Patent
Reid et al.

(10) Patent No.: US 7,088,748 B2
(45) Date of Patent: Aug. 8, 2006

(54) TUNABLE LASER

(75) Inventors: Douglas Charles John Reid, Rugby (GB); Andrew Cannon Carter, Northants (GB)

(73) Assignee: Bookham Technology, plc, abingdon (GB)

( * ) Notice: Subject to any disclaimer, the term of this patent is extended or adjusted under 35 U.S.C. 154(b) by 172 days.

(21) Appl. No.: 10/472,254

(22) PCT Filed: Mar. 14, 2002

(86) PCT No.: PCT/GB02/01170

§ 371 (c)(1),
(2), (4) Date: Sep. 19, 2003

(87) PCT Pub. No.: WO02/075875

PCT Pub. Date: Sep. 26, 2002

(65) Prior Publication Data

US 2004/0081211 A1    Apr. 29, 2004

(30) Foreign Application Priority Data

Mar. 19, 2001   (GB) .................... 0106791.7

(51) Int. Cl.
    *H01S 3/10*    (2006.01)
    *H01S 5/00*    (2006.01)
    *H01S 3/08*    (2006.01)
(52) U.S. Cl. ............ 372/20; 372/46.01; 372/92; 372/96; 372/102
(58) Field of Classification Search ............ 372/20, 372/46.01, 92, 96, 102
See application file for complete search history.

(56) References Cited

U.S. PATENT DOCUMENTS

| | | | | |
|---|---|---|---|---|
| 4,885,753 A | * | 12/1989 | Okai et al. | 372/45.01 |
| 5,084,894 A | * | 1/1992 | Yamamoto | 372/50.22 |
| 5,088,097 A | * | 2/1992 | Ono et al. | 372/20 |
| 5,155,736 A | * | 10/1992 | Ono et al. | 372/20 |
| 5,325,382 A | * | 6/1994 | Emura et al. | 372/26 |
| 5,325,392 A | * | 6/1994 | Tohmori et al. | 372/96 |
| 5,337,328 A | * | 8/1994 | Lang et al. | 372/45 |
| 5,379,318 A | * | 1/1995 | Weber | 372/96 |
| 5,379,348 A | | 1/1995 | Watanabe et al. | 382/8 |
| 5,502,741 A | | 3/1996 | Carroll et al. | |
| 5,838,714 A | * | 11/1998 | Delorme | 372/96 |
| 6,198,863 B1 | | 3/2001 | Lealman et al. | |

FOREIGN PATENT DOCUMENTS

| | | |
|---|---|---|
| EP | 0 559 192 | 9/1993 |
| GB | 2304423 | 3/1997 |

\* cited by examiner

*Primary Examiner*—Minsun Oh Harvey
*Assistant Examiner*—Phillip Nguyen
(74) *Attorney, Agent, or Firm*—Lahive & Cockfield, LLP; Anthony A. Laurentano, Esq.

(57) ABSTRACT

A tuneable laser having an active section, a phase section and a Bragg reflector comprising a plurality of descrete grating units, at least two of which gratings have a discrete pitch, wherein at least two of the gratings having a different pitch are each provided with a plurality of independently actuable electrodes.

16 Claims, 4 Drawing Sheets

TUNABLE LASER

RELATED APPLICATIONS

This application is a 35 U.S.C. 371 national stage filing of International Application No. PCT/GB02/01170, filed 14 Mar. 2002, which claims priority to Great Britain Patent Application No. 0106791.7 filed on 19 Mar. 2001 in Great Britain. The contents of the aforementioned applications are hereby incorporated by reference.

FIELD OF THE INVENTION

The invention relates to a tuneable laser, in particular but not exclusively to a three section distributed Bragg reflector tuneable laser.

BACKGROUND ART

Tuneable lasers are well known in the field of optical communications, particularly in connection with wavelength divisional multiplex telecommunication systems, which rely upon either being fed by stacks of individually wavelength distributed Bragg reflectors (DBR) lasers, which can be individually selected, or by a wide tuning range tuneable laser that can be electronically driven to provide the wavelength required. Limited tuning range tuneable lasers that rely upon thermal effects for tuning are also available.

U.S. Pat. No. 4,896,325 discloses a wavelength tuneable laser having sampled gratings at the front and rear of its gain region. The gratings produce slightly different reflection combs which provide feedback into the device. The gratings can be current tuned in wavelength with respect to each other. Co-incidence of a maximum from each of the front and rear gratings is referred to as a supermode. To switch the device between super modes requires a small electrical current into one of the gratings to cause a different pair of maxima to co-incide in the manner of a vernier. By applying different electrical currents to the two gratings, continuous tuning within a supermode can be achieved. In practice, the reflection spectra of the known sampled grating structures have a Gaussian type envelope which limits the total optical bandwidth over which the laser can reliably operate as a single mode device.

In contrast to the Segmented Grating Distributed Bragg Reflector (SG-DBR) described above, a Phase Shift Grating Distributed Bragg Reflector (PSG-DBR) is disclosed in GB 2337135. This has a plurality of repeat grating units in which each grating unit comprises a series of adjacent gratings having the same pitch, which gratings are separated by a phase change of $\pi$ radians, wherein the gratings have different lengths to provide a pre-determined reflection spectrum.

The known devices have Bragg gratings which bound both ends of the gain and phase regions of a four section tuneable laser, which produces a comb wavelength response. For a given set of drive currents in the front and rear grating sections, there is simultaneous correspondence in reflection peak at only one wavelength, as a consequence of which the device lases at that wavelength. To change this wavelength a different current is applied to the front and rear gratings. Thus the front and rear gratings operate in a vernier mode, in which the wavelengths of correspondence determine a supermode wavelength. Although the known devices have generally been acceptable, they share a tendency to suffer from short wavelength losses, which in combination with the front grating tuning absorption reduces the output power of the laser.

SUMMARY OF THE INVENTION

The present invention seeks to provide a tuneable laser with a higher optical output power whilst having acceptable manufacturing costs.

According to the invention, there is provided a tuneable laser having an active section, a phase section and a Bragg reflector comprising a plurality of discrete grating units, wherein at least one grating unit has at least two independently actuable electrodes and in which at least two of the grating units have different pitches.

In use, the desired wavelength of the laser can be selected by applying an electric current to only one of the electrodes associated with each grating associated with a particular wavelength. By applying a current to only one electrode, the refractive index in the region of the grating under the said electrode will locally decrease the refractive index. This results in the individual reflection peak in the reflection comb being split. By applying an equal electric current to both electrodes associated with the grating for the desired wavelength, this latter wavelength becomes the pre-dominant wavelength at which the device will lase. This wavelength can then be current controlled in the known manner.

Preferably the tuneable laser is provided with a simple partial reflecting front mirror. In a preferred embodiment, the Bragg reflector comprises three or more, preferably six, discrete grating units each having a discrete pitch. Preferably, the pitch of the gratings increases with distance from the gain region. Preferably, each grating unit is provided with two independently actuable electrodes. Preferably a conventional switching circuit is provided to switch the current to the electrodes and grating units.

The tuneable laser of the invention has a number of advantages over the known designs, in particular minimising the short wavelength losses inherent in the four section DBR lasers of the prior art, thereby having higher power output. By dispensing with the front Bragg reflector, absorption losses are minimised as there is no contribution to tuning induced absorption from the front Bragg reflector, which usually dominates absorption. Also the absorption losses due to tuning in the Bragg reflector is reduced than in known SG-DBR lasers as the use of a shorter grating is facilitated.

BRIEF DESCRIPTION OF THE DRAWINGS

Embodiments of the invention will now be described by way of example, with reference to the accompanying figures, in which.

DETAILED DESCRIPTION OF THE EMBODIMENTS

Figure 1:
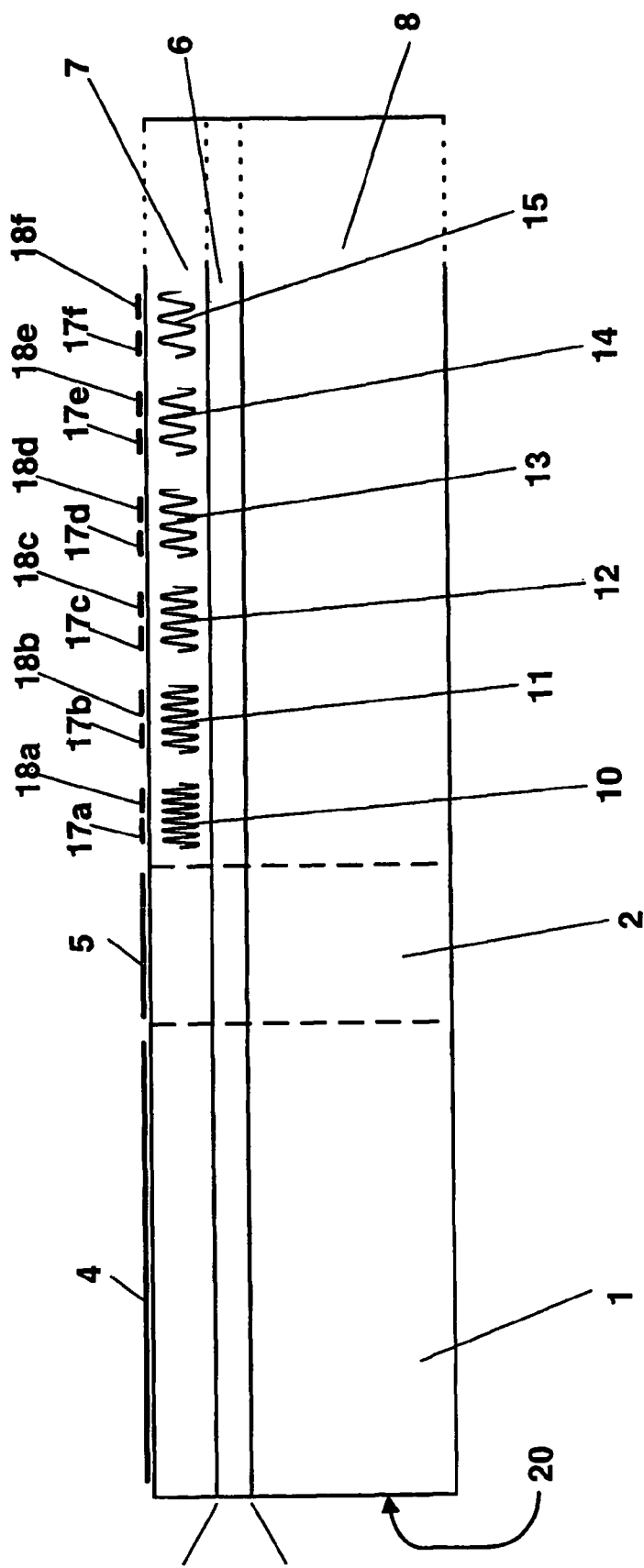
FIG. 1 shows a schematic representation of a three section laser according to a first embodiment.

FIG. 1 shows a schematic three section tuneable DBR semiconductor laser having an active or gain section 1, a phase section 2 and a rear mirror section 3. Both the gain section 1 and the phase section 2 are provided with electrodes 4, 5. At the boundary of the gain section 1, a front mirror 20 is provided, which mirror can be a simple partial reflecting mirror or other suitable mirror. The laser further comprises an active region 6, the Bragg reflector layer 7 and substrate layer 8.

The rear mirror section 3 has a plurality of discrete Bragg grating units 10–15 etched into the waveguide, each of which has a discrete pitch corresponding to a desired wavelength. Each of the grating units 10–15 is spatially separated from the adjacent grating unit. Also, each grating unit is provided with two electrodes 17a–f, 18a–f, which are adapted to be independently actuable from one another and the other electrodes in the rear mirror section.

In use in, for example, a C-Band or L-Band 40 nm wide optical communication system, the difference in wavelength between adjacent grating units 10–15 will typically be about 7 nm and the pitch of the respective grating unit 10–15 can b determined by the Bragg condition:

$$\lambda = 2n_{eff}\Lambda$$

where $\lambda$ is wavelength, $n_{eff}$ is the effective refractive index of the waveguide material, $\Lambda$ is the pitch, for first order gratings, which are preferred as they provide the strongest coupling.

Figure 2:
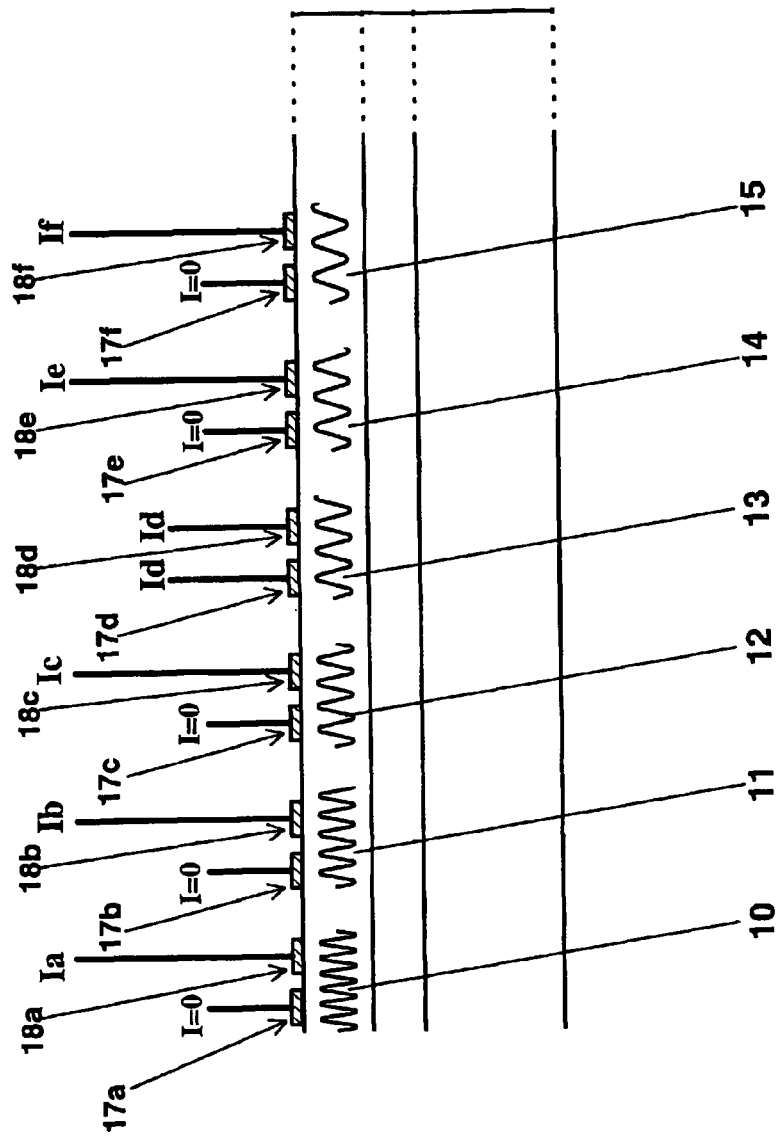
FIG. 2 shows a schematic representation of the Bragg reflector of FIG. 1.

FIG. 2 shows a schematic representation of a Bragg reflector forming the rear mirror section 3. The Bragg reflector comprises a plurality, in this case six, of discrete grating units 10–15, each having a discrete pitch. The grating unit closest to the phase section 2 has the shortest pitch and the pitch of each successive grating unit remote from the phase section is greater than the pitch of the preceding unit. Two electrodes 17a–f, 18a–f are associated with each grating unit 10–15, which electrodes are independently actuable of one another. The Bragg gratings can be fabricated using electron beam writing techniques or phase mask holographic techniques.

In use, a grating unit corresponding to a particular desired wavelength is selected (e.g. 13) and current is applied to both electrodes (17d, 18d). This has the effect of lowering the effective refractive index of the grating and therefore the Bragg wavelength of the grating. However, by applying a current to only one of the electrodes (18a–c, e–f), the effective refractive index of a part of the grating will be changed but the remaining part will remain unchanged as the current will only spread slightly through the layer in which the grating is etched. This has the effect that the reflection maxima for that particular grating is split into two maxima having a maximum intensity of about half the previous maxima at slightly different wavelengths. If this is undertaken at all of the gratings except the grating corresponding to the desired wavelength, then this latter wavelength becomes the dominant wavelength in the active cavity. The laser will therefore lase at this wavelength, which can then be current tuned.

By selectively applying current to just one the electrodes of all grating units except the grating unit corresponding to the desired wavelength, the laser can be current tuned across the reflection spectrum by a combination of desired grating selection and control of the current to said desired grating. The grating corresponding to the desired wavelength has equal current driven into each of its grating unit electrodes, wherein the current is varied to tune the wavelength down to its next adjacent grating wavelength.

Figure 3A:
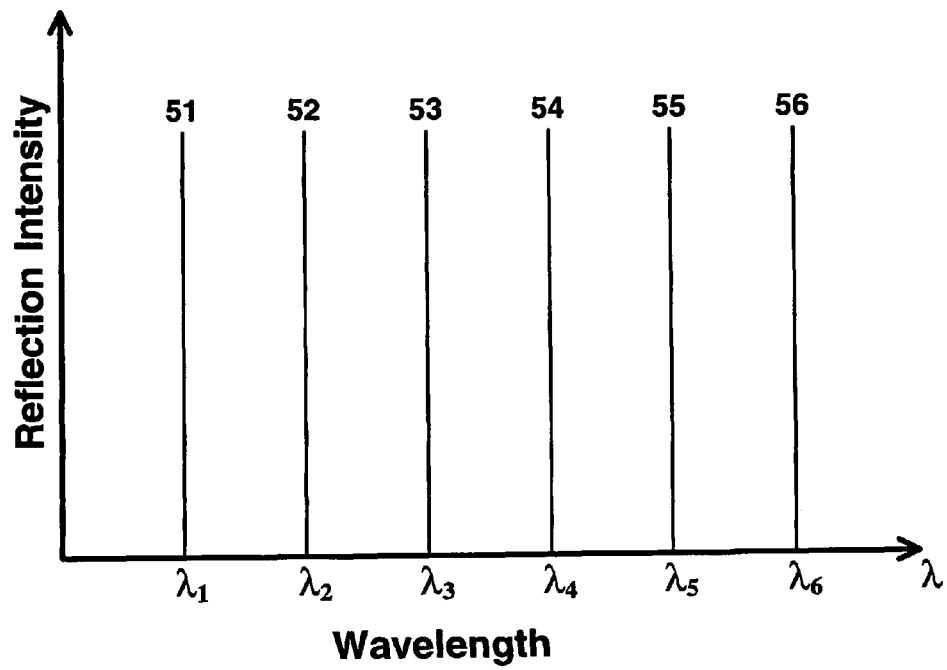
FIG. 3a shows a wavelength envelope using a known Bragg reflector.

FIG. 3a shows the typical reflection spectrum obtained using a prior art phase shifted Bragg reflector such as is known from GB 2337135. Such a reflector has a number of discrete reflection peaks, which are of substantially similar intensities. These peaks are generally separated by about 7 nm for a C-Band or L-Band device and a device incorporating such a reflector can be tuned to lase in the known manner by causing superposition of the individual modes.

Figure 3B:
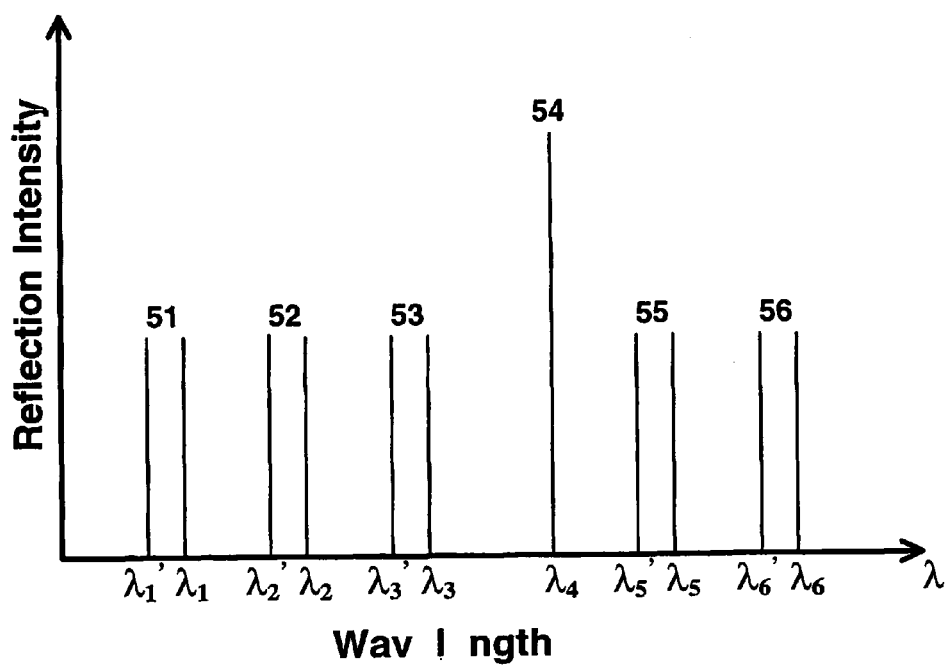
FIG. 3b shows a wavelength envelope using the Bragg reflector of FIG. 1.

The reflector of the invention has a similar reflection spectrum to that in shown in FIG. 3a, when no current is applied to the electrodes associated with the grating units. However, when current is applied to one of each electrodes in the manner described in relation to FIG. 2 and to both electrodes of the grating unit associated with the desired wavelength, a spectrum is obtained as shown in FIG. 3b. In this case, each of the reflection peaks 51, 52, 53, 55 and 56 has been split into two equal reflection peaks having approximately half the intensity of the remaining reflection peak 54. It is at the wavelength of the remaining reflection peak 54 that the device will lase.

Figure 4:
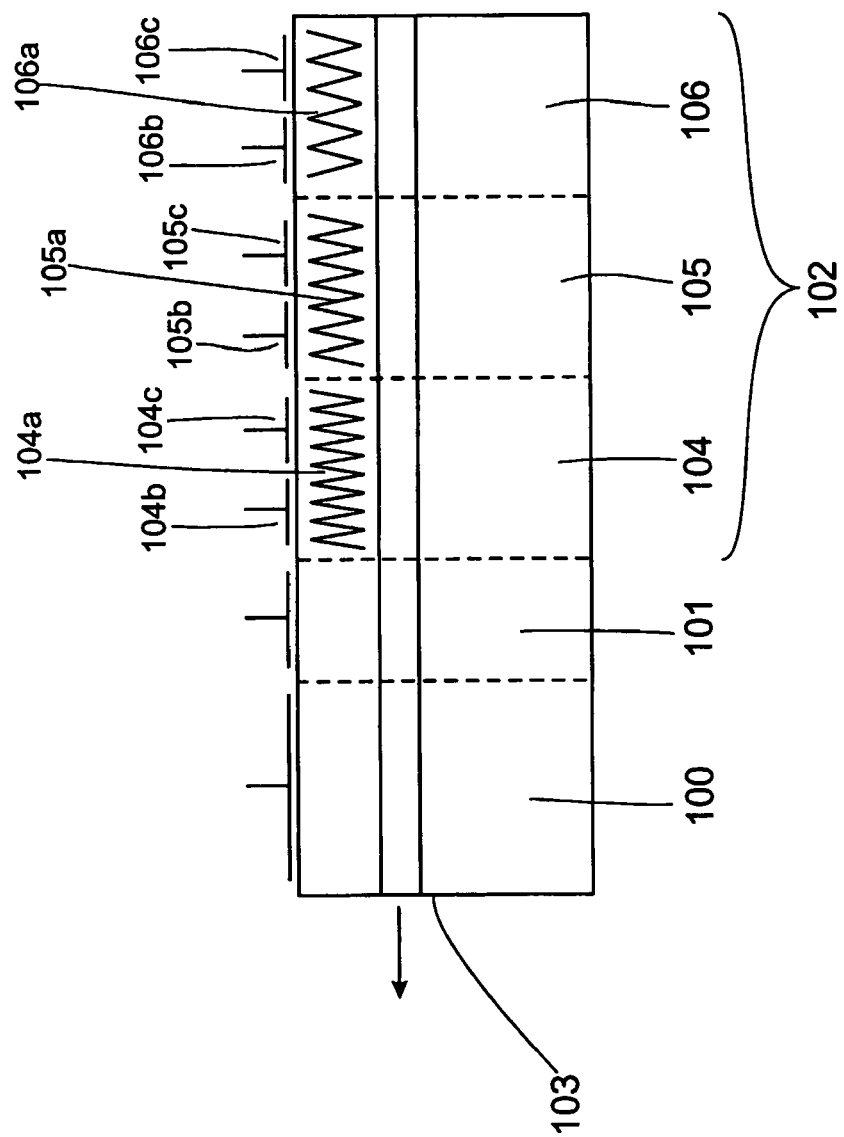
FIG. 4 shows a second embodiment.

Referring now to the laser as shown in FIG. 4, it can be seen that again there is a gain section 100 and a phase change section 101. A mirror section 102 and a non-selective front mirror 103 define the lasing cavity.

The mirror section 102 has three Bragg grating sections 104, 105 and 106. Each section has a Bragg grating 104a, 105a and 106a which has a constant pitch with pitch 105a being larger than 104a but smaller than 105a. Each section 104 to 106 has a pair of electrodes 104b, 104c etc which operate in the manner described above with reference to FIGS. 1 and 2.

Although in general, current is only applied to one of each pair of electrodes, it would be possible to apply small currents, e.g. an order of magnitude less than the main current, to the other of the pair of electrodes. By applying small currents to all gratings, they can be made to track. It would also be equally possible to have three or more electrodes associated with each grating unit for particular applications, such as greater discrimination of the major reflection peak.

Generally, the phase shift will be controlled using the phase section in a conventional manner. It would, however, be possible to control the phase by selectively applying current to the electrodes located between the reflecting grating and the active section.

Although the front mirror is preferably a simple partial reflecting mirror, it can be any suitable mirror which will have the same reflection spectrum as the rear mirror. Whilst a simple mirror will minimise losses, a Bragg grating could also be used.

The invention design may be suitably applied to solid state lasers manufactured using Group III-V or other semiconductor materials.

The photoluminescent gain curve of semiconductor materials is curved with intensity falloff at the edges of the spectrum. To produce a uniform intensity gain response across the bandwidth of interest, the Bragg grating unit lengths can be varied to give enhanced reflectivity where required.

The reflectively profile of a grating can be controlled such that the reflection peach has a sharp definition at the wavelength of interest thereby giving good side mode suppression. An example of such a grating is one that has along each its length a Gaussian or Lorentzian reflectively profile.

It will of course be appreciated that many variations can be made to the above-described embodiments, without departing from the scope of the invention.

What is claimed is:

1. A tuneable laser, comprising an active section, a phase section and a Bragg reflector comprising three or more discrete grating units, wherein each grating unit has at least two independently actuable electrodes, wherein each grating unit has a constant pitch and wherein each grating unit has a different pitch to that of each other grating unit, the laser being arranged such that it is tuned to a desired wavelength by applying current to both of the independently actuable electrodes of one selected grating unit only, and by applying current to all of the other grating units via only one of the at least two independently actuable electrodes of each of those grating units, such that the tuneable laser lases at the wavelength to which the selected grating unit is tuned.

2. A tuneable laser according to claim 1, wherein the tuneable laser further comprises a partial reflecting mirror disposed on a front portion thereof.

3. A tuneable laser according to claim 1 wherein the Bragg reflector comprises six discrete grating units.

4. A tuneable laser according to claim 1, wherein the pitch of the grating units increases with distance from the active region.

5. A tuneable laser according to claim 1, wherein one of said active region, phase section and Bragg reflector is formed from a semiconductor material.

6. A tuneable laser according to claim 5, wherein the semiconductor material is a Group III-V semiconductor material.

7. A tuneable laser according to claim 1, manufactured using electron beam grating writing techniques.

8. A tuneable laser according to claim 1, manufactured using a holographic phase grating plate.

9. A tuneable laser according to claim 1, wherein each of said plurality of grating units have a length, and wherein the lengths of the grating units are configured to produce a substantially uniform gain intensity response.

10. A tuneable laser according to claim 1, wherein substantially the same current is applied to both of the independently actuable electrodes of said one selected grating unit.

11. A tuneable laser, comprising an active section, a phase section and a Bragg reflector comprising three or more discrete grating units, wherein each grating unit has at least two independently actuable electrodes, wherein each grating unit has a constant pitch and wherein each grating unit has a different pitch to that of each other grating unit, the laser being arranged such that it is tuned to a desired wavelength by applying substantially the same current to both of the independently actuable electrodes of one selected grating unit only, and by applying different currents to the at least two independently actuable electrodes of each of the other grating units, such that the tuneable laser lases at the wavelength to which the selected grating unit is tuned.

12. A method for tuning a laser to a desired wavelength, the method comprising steps of:
  providing a tuneable laser having an active section, a phase section and a Bragg reflector, wherein the Bragg reflector includes three or more discrete grating units, wherein each grating unit has at least two independently actuable electrodes, wherein each grating unit has a constant pitch, and wherein each grating unit has a different pitch to that of each other grating unit;
  applying current to both of the at least two independently actuable electrodes of one selected grating unit; and
  applying current to only one of the at least two independently actuable electrodes of each of the other grating units,
  wherein the tuneable laser lases at a wavelength to which the selected grating unit is tuned.

13. A method according to claim 12, wherein the pitch of the grating units increases with distance from the active region.

14. A method according to claim 12, wherein one of the active region, phase section and Bragg reflector is formed from a semiconductor material.

15. A method according to claim 12, wherein each of the grating units has a length, and the lengths of the grating units are configured to produce a substantially uniform gain intensity response.

16. A method according to claim 12, wherein substantially the same current is applied to the independently actuable electrodes of the selected grating unit.

* * * * *